(12) United States Patent
Fukasawa et al.

(10) Patent No.: US 6,744,194 B2
(45) Date of Patent: Jun. 1, 2004

(54) LIGHT EMITTING DIODE

(75) Inventors: Koichi Fukasawa, Yamanashi (JP);
Hirohiko Ishii, Yamanashi (JP)

(73) Assignee: Citizen Electronics Co., Ltd.,
Fujiyoshida (JP)

( * ) Notice: Subject to any disclaimer, the term of this patent is extended or adjusted under 35 U.S.C. 154(b) by 115 days.

(21) Appl. No.: 09/953,302

(22) Filed: Sep. 17, 2001

(65) Prior Publication Data

US 2002/0039002 A1 Apr. 4, 2002

(30) Foreign Application Priority Data

Sep. 29, 2000 (JP) ........................................ 2000-298579

(51) Int. Cl.⁷ .............................. H01J 1/62; H01J 63/04
(52) U.S. Cl. ................ 313/486; 252/301.6 P; 252/301.36; 313/487
(58) Field of Search ................. 313/486, 467; 252/301.6 P

(56) References Cited

U.S. PATENT DOCUMENTS 5,847,507 A * 12/1998 Butterworth et al. ....... 313/512
6,066,861 A *  5/2000 Hohn et al. .................... 257/99

FOREIGN PATENT DOCUMENTS

| JP | 408064860 A | * | 3/1996 | ........... H01L/33/00 |
| JP | 2001308393 | * | 11/2001 | ........... C09K/11/08 |

OTHER PUBLICATIONS

Patent Abstracts of Japan: Publication No. 2000–223750; Date of Publication Aug. 11, 2000.
Patent Abstracts of Japan: Publication No. 2000–223749; Date of Publication Aug. 11, 2000.
Patent Abstracts of Japan: Publication No. 2000–150960; Date of Publication May 30, 2000.
Patent Abstracts of Japan: Publication No. 06–077537; Date of Publication Mar. 18, 1994.
Patent Abstracts of Japan: Publication No. 2000–236112; Date of Publication Aug. 29, 2000.
Patent Abstracts of Japan: Publication No. 10–173239; Date of Publication Jun. 26, 1998.
Patent Abstracts of Japan: Publication No. 11–145519; Date of Publication May 28, 1999.

* cited by examiner

*Primary Examiner*—Sandra O'Shea
*Assistant Examiner*—Sumati Krishnan
(74) *Attorney, Agent, or Firm*—Browdy and Neimark

(57) ABSTRACT

A light emitting diode is disclosed which is small and inexpensive and can emit a variety of intermediate colors of light with a single light emitting element chip and whose current consumption is small. This invention provides a light emitting diode which comprises: a substrate; electrodes formed on the substrate; a light emitting element chip connected to the electrodes and mounted on an upper surface of the substrate; a resin material sealing an upper surface side of the light emitting element chip; and fluorescent particles and coloring particles scatteringly distributed in the resin material. The coloring particles absorb a part of wavelengths of light from the light emitting element chip and a part of wavelengths of light that have been changed by the fluorescent particles.

6 Claims, 7 Drawing Sheets

LIGHT EMITTING DIODE

BACKGROUND OF THE INVENTION

1. Field of the Invention

The present invention relates to an improvement in a light emitting diode and more specifically to a light emitting diode which converts a natural color of light from a light emitting element chip into a soft, intermediate pastel color.

2. Description of the Prior Art

A conventional practice to produce an intermediate color of light involves simultaneously causing two or more light emitting element chips to emit different colors of light and mixing them. An example light emitting diode of this kind is a surface mount type light emitting diode 1 which has two light emitting element chips 3, 4 that produce two different colors of light, as shown in FIG. 1. This light emitting diode 1 has a glass epoxy substrate 2 forming a base, two light emitting element chips 3, 4 mounted on the substrate to emit different colors of light, and a resin sealing member 5 covering the light emitting element chips 3, 4 from above. On the upper surface of the glass epoxy substrate 2 are provided cathode electrodes 6a, 6b for securely holding the two light emitting element chips 3, 4 and anode electrodes 8a, 8b connected to the light emitting element chips 3, 4 through bonding wires 7.

In the light emitting diode 1, when the two light emitting element chips 3, 4 are made from a blue color chip and a red color chip, respectively, violet light can be produced by causing the two chips to emit light simultaneously and mixing the different colors of emitted light.

A light emitting diode 10 is also known which has three light emitting element chips mounted thereon and mixes multiple colors to produce a desired color of light, as shown in FIG. 2. This light emitting diode 10 comprises three light emitting element chips 12, 13, 14 mounted on a base 11 that emit light in red, blue and green, respectively, electrode terminals 15, 16, 17 connected to the light emitting element chips 12, 13, 14, respectively, and a bullet-shaped resin sealing member 18 covering the light emitting element chips 12, 13, 14 from above. The light emitting diode 10 of this construction can produce light of almost any color by combining the three light emitting element chips 12, 13, 14 that emit light in red, blue and green (see Masakazu Matsumoto, "Electronic Display," from Ohmsha Co., Ltd., p213, FIGS. 6 & 20, Jul. 7, 1995).

In either of the light emitting diodes 1, 10 described above, to produce an intermediate color of light requires two or more light emitting element chips that emit different colors of light. This necessarily increases the size of the package of the light emitting diode and requires a control circuit to individually control the mounted light emitting element chips, thus complicating the control method. Depending on the kinds of light emitting element chips combined, an optimum balance in brightness among different colors may not be able to be established. For example, if one of the light emitting element chips to be used in combination has a low brightness, an adjustment must be made to match other light emitting element chips to the low-brightness chip, giving rise to a problem that performances of high-luminance light emitting element chips cannot be fully exploited.

The light emitting diodes 1, 10 described above also have a problem of a large current consumption resulting from the need to make a plurality of light emitting element chips produce light simultaneously.

SUMMARY OF THE INVENTION

An object of the present invention is to provide a light emitting diode capable of producing a variety of intermediate colors of light with a single light emitting element chip.

Another object of the present invention is to provide a small, inexpensive light emitting diode.

Still another object of the present invention is to provide a light emitting diode which consumes a small amount of current in the light emitting element chip and which has no need to control the current.

According to one aspect, the present invention provides a light emitting diode which comprises: a substrate; a light emitting element chip mounted on the substrate; a wavelength conversion material to receive light from the light emitting element chip and change wavelengths of the received light; and a wavelength absorbing material to receive the light from the light emitting element chip and the wavelength conversion material and absorb a part of the wavelengths of the received light.

The substrate is formed with electrodes, which are connected to the light emitting element chip.

The wavelength conversion material is made from, for example, fluorescent particles and the wavelength absorbing material is made from, for example, coloring particles.

It is preferred that the wavelength conversion material and the wavelength absorbing material be dispersed in a scatteringly distributed condition in a cover member enclosing the light emitting element chip.

The cover member may be made from a light transmitting resin material.

Because the resin material is mixed with the fluorescent particles for producing light with a wider range of wavelength and with coloring particles for absorbing a desired wavelength range, it is possible to produce a soft, intermediate, pastel color of light based only on the color of light emitted by a single light emitting element chip.

According to another aspect of the present invention, the fluorescent particles are made from yttrium aluminum garnet (YAG).

Because this invention uses yttrium aluminum garnet (YAG) for the fluorescent particles, a wide range of wavelengths, 400 nm to 700 nm, can be produced stably and efficiently by exciting the fluorescent particles.

According to still another aspect of the present invention, the coloring particles are made from a dye which absorbs a part of wavelengths of light from the light emitting element chip and a part of wavelengths of light that were changed by the fluorescent particles.

Because this invention uses a dye for the coloring particles, it is possible to produce a soft, intermediate, pastel color of light with low cost.

According to a further aspect of the present invention, the light emitting element chip is a blue light emitting diode element formed of a gallium nitride compound semiconductor.

These and other features and advantages of the present invention will be described in more detail by referring to the accompanying drawings.

DESCRIPTION OF THE PREFERRED EMBODIMENTS

Figure 1:
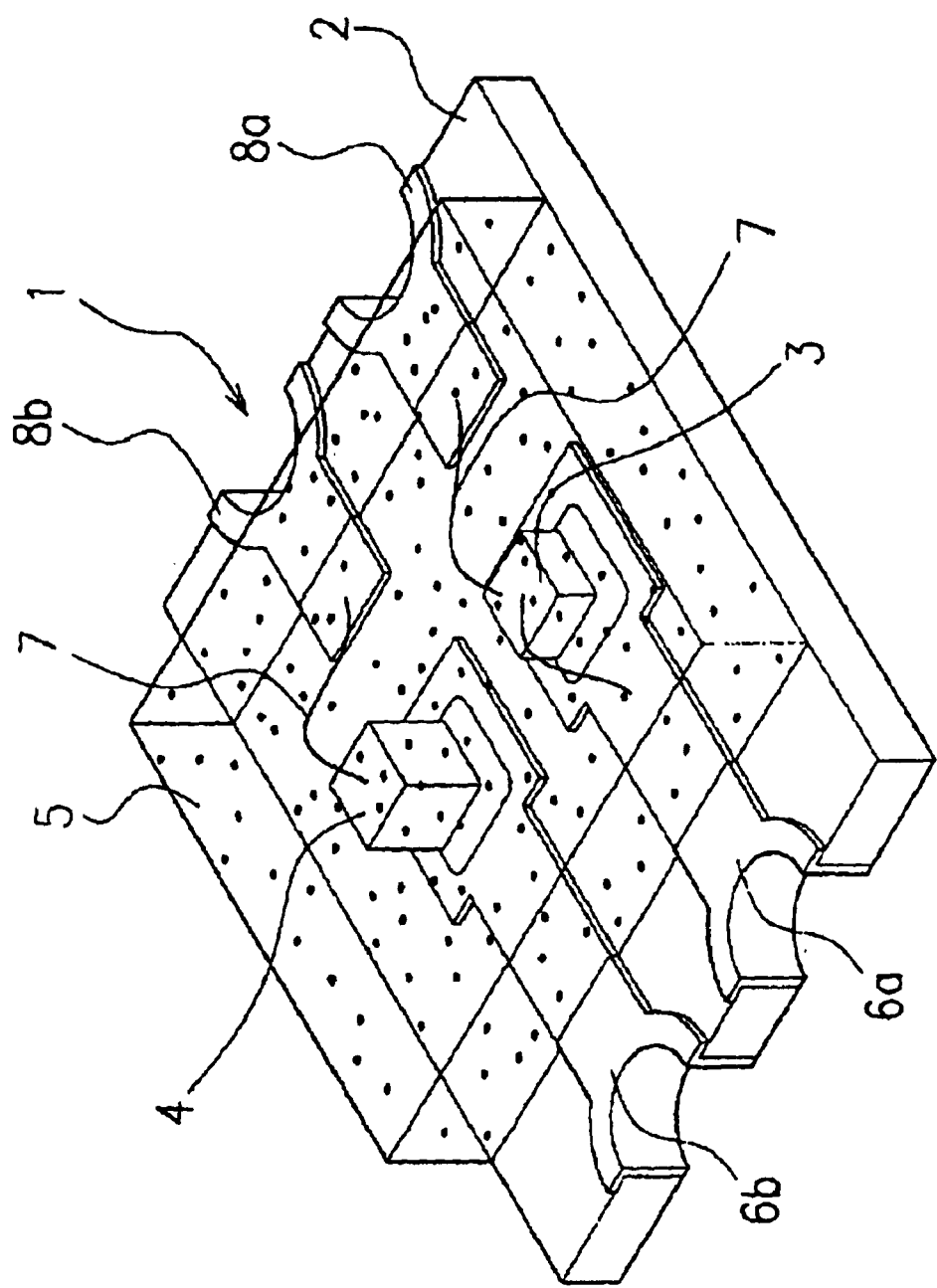
FIG. 1 is a perspective view showing an example of a conventional surface mount type multicolor light emitting diode.
Figure 2:
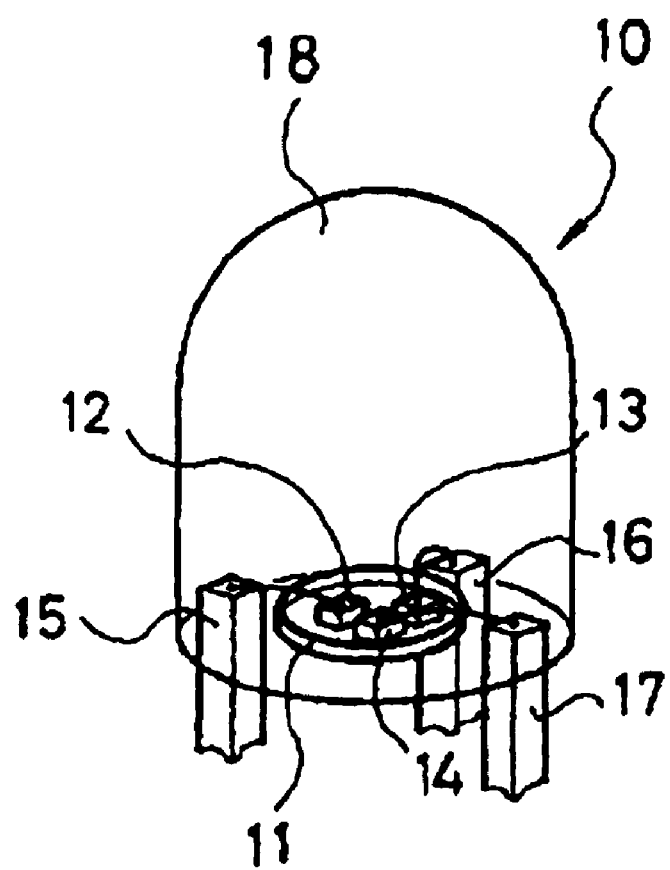
FIG. 2 is a perspective view showing an example of a conventional lead frame type multicolor light emitting diode.
Figure 3:
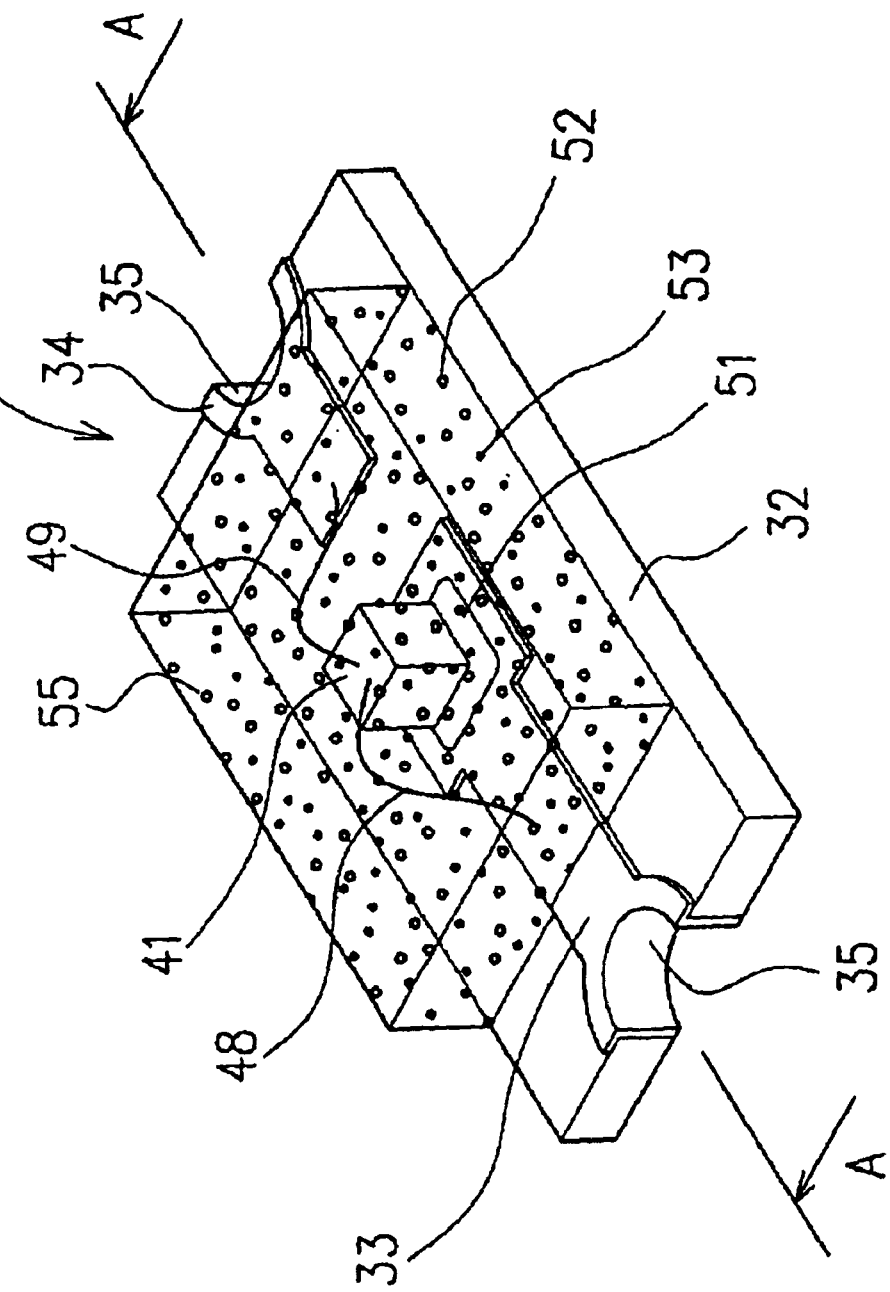
FIG. 3 is a perspective view showing a light emitting diode as a first embodiment of the present invention.
Figure 4:
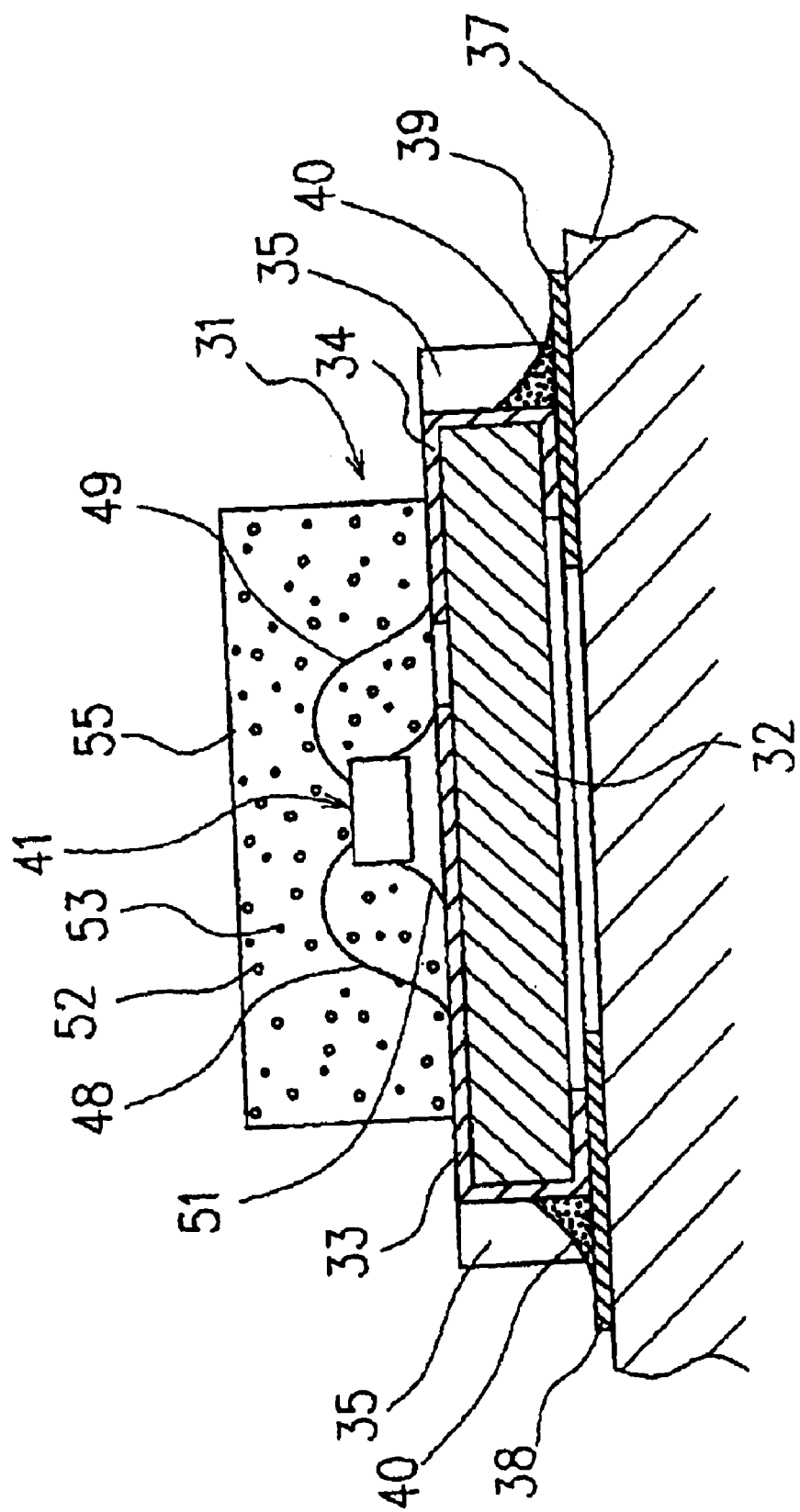
FIG. 4 is a cross-sectional view of the light emitting diode of the first embodiment taken along the line A—A of FIG. 3 when the light emitting diode is mounted on a mother board.
Figure 5:
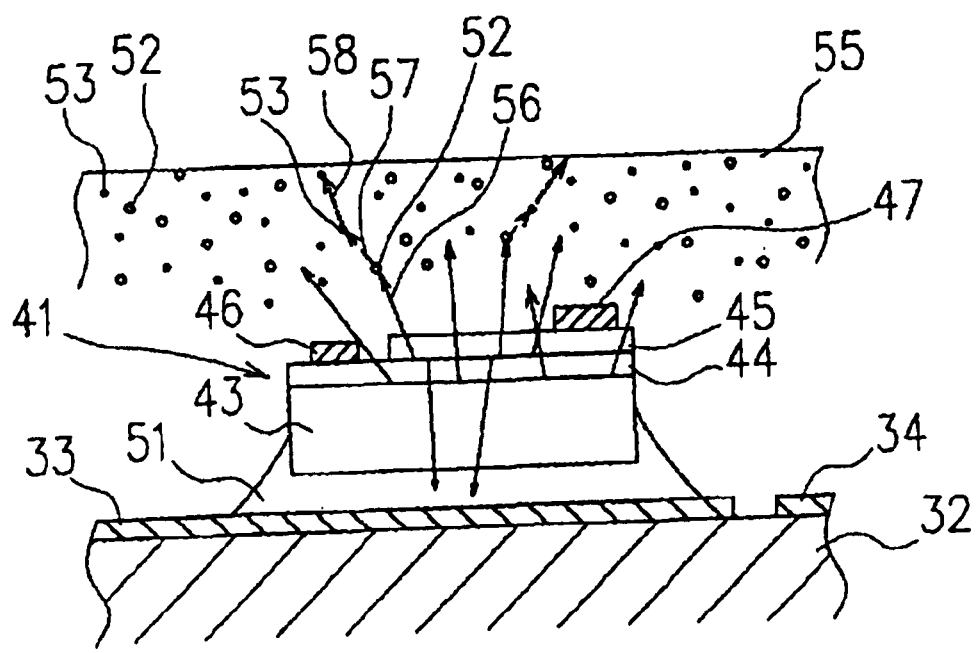
FIG. 5 is an explanatory diagram showing how light emitted from the light emitting element chip in the light emitting diode is changed in wavelength.

Now, embodiments of a light emitting diode according to the present invention will be described in detail by referring to the accompanying drawings. FIG. 3 to FIG. 5 represent the first embodiment of the invention which is implemented as a surface mount type light emitting diode. A surface mount type light emitting diode 31 of this embodiment has a rectangular substrate 32, a pair of electrodes (a cathode electrode 33 and an anode electrode 34) patterned on the substrate 32, and a light emitting element chip 41 arranged almost at a center on the upper surface of the substrate 32. The light emitting diode 31 is surface-mounted on a mother board 37 by having its electrodes 33, 34 soldered at 40 on the underside to printed wires 38, 39 (see FIG. 4).

The light emitting element chip 41 is secured to the substrate 32 by a bonding agent 51 applied to the underside thereof. The light emitting element chip 41 is a blue light emitting element made of a gallium nitride compound semiconductor which is grown by diffusing an n-type semiconductor 44 and a p-type semiconductor 45 over the upper surface of an element substrate 43 of sapphire glass, as shown in FIG. 5. The n-type semiconductor 44 and the p-type semiconductor 45 have an n-type electrode 46 and a p-type electrode 47, respectively, which are connected through bonding wires 48, 49 to the cathode electrode 33 and the anode electrode 34, respectively, provided on the substrate 32. Supplying a predetermined amount of current causes the light emitting element chip 41 to emit light in blue.

This invention is characterized by a wavelength conversion material which, upon receiving light from the light emitting element chip 41, changes the wavelength of the received light and also by a wavelength absorbing material which, upon receiving light from the light emitting element chip and the wavelength conversion material, absorbs a part of the wavelengths of the received light. To describe in more detail, in this embodiment the wavelength conversion material is made from fluorescent particles 52 and the wavelength absorbing material is made from coloring particles 53.

The fluorescent particles 52 and the coloring particles 53 are preferably scattered in a cover member, for example, a light transmitting resin material 55, which encloses the light emitting element chip 41 and seals and protects the substrate 32. More specifically, the resin material 55 is a transparent base material of silicone resin which is mixed with appropriate amounts of yttrium aluminum garnet (abbreviated YAG), the material for the fluorescent particles 52, and of dye, the material for the coloring particles 53. The added materials are uniformly scattered. The resin material 55 containing the fluorescent particles 52 and the coloring particles 53 is formed in a rectangular parallelepiped shape over the upper surface of the substrate 32 except for through-hole portions 35 in the cathode electrode 33 and anode electrode 34.

The dye used as the coloring particles 53 is made as follows. Appropriate amounts of, for example, four compounds—phthalocyanine compound, anthraquinone compound, azo compound and quinophthalone compound—are mixed to generate six colors in advance, i.e., blue, green, yellow, orange, red and violet. In this case, a blue is produced from the phthalocyanine compound, and a green is produced by mixing the phthalocyanine compound and the anthraquinone compound. A yellow is made from the quinophthalone compound, and an orange and a red are produced by mixing the anthraquinone compound and the azo compound. A violet is made either by using the anthraquinone compound or by mixing the phthalocyanine compound, anthraquinone compound and azo compound. In this embodiment, these six colors produced in this manner in advance are further mixed to generate a desired chromaticity. The coloring particles 53 are not limited to the above-described dye but a pigment may also be used.

In the light emitting diode 31 of this embodiment, when a current flows through the light emitting element chip 41, blue light is produced at a boundary plane between the n-type semiconductor 44 and the p-type semiconductor 45. The blue light is emitted as blue rays of light 56 in various directions, upward, sideways and downward. The blue rays 56 emitted upward in particular excite the fluorescent particles 52 scattered in the resin material 55 to produce wavelength-changed yellow rays 57 with a wider range of wavelength which in turn propagate through the resin material 55 in all directions. At the same time, when the yellow rays 57 and the blue rays 56 pass through the coloring particles 53 distributed in the resin material 55, the coloring particles 53 absorb a part of the wavelengths of the yellow rays 57 and blue rays 56, thus producing a variety of intermediate colors of rays 58. Any intermediate color of rays 58 can be formed by appropriately selecting the kind and amount of a dye, the material for the coloring particles 53 scatteringly distributed in the resin material 55. The brightness of an intermediate color can be adjusted by controlling the current flowing through the light emitting element chip 41.

Figure 6:
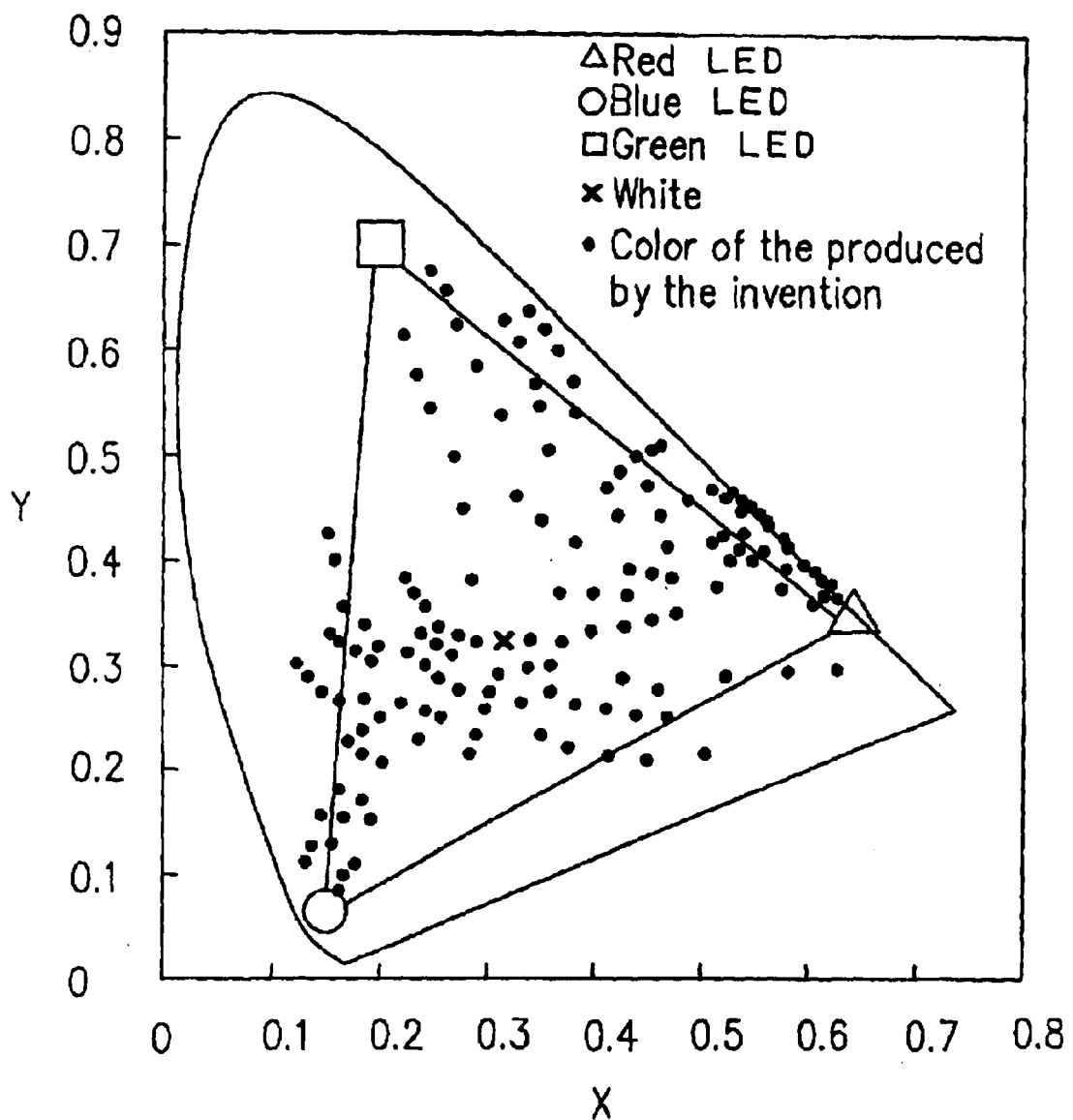
FIG. 6 is a CIE chromaticity diagram showing a result of chromaticity measurements using the light emitting diode of the present invention.

FIG. 6 is a CIE chromaticity diagram showing a result of chromaticity measurement when various intermediate colors of rays 58 are produced by the light emitting diode 31. The diagram has found that although the color of light produced varies depending on the kind of the coloring particles 53 used, many rays are observed in an intermediate color range and few rays light up in those areas on or around the lines connecting the red LED, blue LED and green LED which are close to primary colors.

Figure 7:
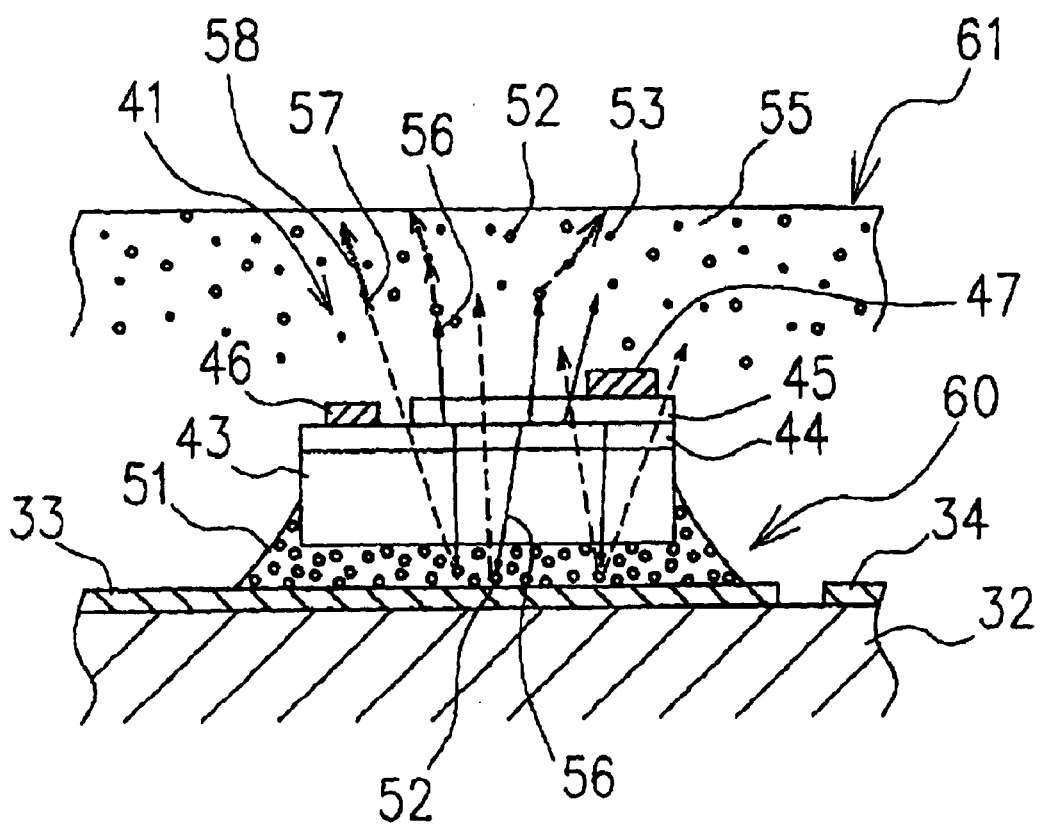
FIG. 7 is an explanatory diagram showing how light emitted from a light emitting element chip in a light emitting diode of a second embodiment is changed in wavelength.

FIG. 7 shows a light emitting diode according to the second embodiment of the invention. In this embodiment, the bonding agent 51 that bonds the light emitting element chip 41 to the substrate 32 is also mixed with the fluorescent particles 52 to form a fluorescent bonding layer 60 so that the rays of light propagating downward from the light emitting element chip 41 can also be changed in wavelength, thereby producing a brighter intermediate color of light. Since other constitutional elements are similar to those of the first embodiment shown in FIGS. 3 to 5, their detailed explanations are omitted. In this embodiment, because the fluorescent particles 52 are mixed in the bonding agent 51, the blue rays 56 propagating downward from the light emitting element chip 41 excite the fluorescent particles 52 distributed in the fluorescent bonding layer 60 and at the same time the blue rays 56 propagating upward from the light emitting element chip 41 excite the fluorescent particles 52 mixed in the resin material 55, thus producing brighter yellow rays 57. Further, because the amount of rays of an intermediate color 58 produced by the emitted light passing through the coloring particles 53 increases, the brightness of the intermediate color also increases.

Next, the features of light emission in the light emitting diode 61 of the second embodiment will be explained by referring to FIG. 7. When a current flows through the light emitting element chip 41, blue light is produced at the boundary plane between the n-type semiconductor 44 and the p-type semiconductor 45. The blue light is emitted as blue rays of light 56 in various directions, upward, sideways and downward. The blue rays 56 emitted downward in particular excite the fluorescent particles 52 scatteringly distributed in the fluorescent bonding layer 60 to produce wavelength-changed yellow rays 57 which in turn propagate in all directions. Then, the yellow rays 57 and the blue rays 56 are absorbed by the coloring particles 53 distributed in the resin material 55, thus producing a desired intermediate color of light 58. As with the first embodiment, a desired intermediate color of light 58 can be obtained by selecting an appropriate kind and amount of a dye, the material for the coloring particles 53 contained in the resin material 55. Controlling the current applied to the light emitting element chip 41 can adjust the brightness of the light produced.

In either of the embodiments above, we have explained about a chip type light emitting diode directly surface-mounted on the printed wires 38, 39 provided on the upper surface of the mother board 37 as shown in FIG. 4. It should be noted that the light emitting diode according to this invention can also be applied to a lead frame type light emitting diode. That is, a desired intermediate color of light can be produced by rigidly mounting a blue light emitting element chip of gallium nitride compound semiconductor on a base and scatteringly distributing appropriate amounts of the fluorescent particles 52 and the coloring particles 53 in a bullet-shaped resin sealing member.

While, in the embodiments above, we have described the case where the light emitting element chip and the electrodes are connected by wire bonding, the present invention is not limited to this method of connection but also includes other connection methods such as flip-chip mounting using solder bumps.

As described above, by scatteringly distributing the fluorescent particles and coloring particles in the resin material that seals the light emitting element chip, the present invention can provide a light emitting diode that can emit an intermediate color of light with a single light emitting element chip. Further, by adjusting a volume ratio between the fluorescent particles and the coloring particles scatteringly distributed in the resin material, the range of wavelength to be absorbed and the amount of wavelength absorption can be changed, thus producing a variety of intermediate colors of light.

Further, because there is no need to incorporate two or more light emitting element chips with different colors of emitted light, as required by the conventional technology, the size of the light emitting diode can be reduced.

Further, because the color of light emitted by the light emitting diode can be selected by the fluorescent particles and coloring particles mixed in the resin material, there is no need to control the current applied to the light emitting element chip, as is required by the conventional light emitting diode.

The light emitting diode according to the present invention is advantageously used as a chip type light emitting diode for emitting an intermediate color of light and also has a structure suited for mass production.

It should be appreciated that the present invention is not limited to the embodiments described above and that various changes and modifications may be made without departing from the scope of this invention.

What is claimed is:

1. A light emitting diode comprising:

a substrate;

electrodes formed on said substrate;

a light emitting element chip connected to said electrodes and mounted through a bonding agent on an upper surface of said substrate;

a resin material for sealing an upper surface side of said light emitting element chip; and fluorescent particles and at least two different coloring particles contained in said resin material, wherein said coloring particles are dyes selected from the group consisting of phthalocyanine, anthraquinone, azo and quinophthalone compounds capable of producing intermediate colors in combination thereof, wherein said coloring particles are capable of absorbing a portion of wavelengths of light in which the wavelengths are converted by the fluorescent particles to emit light of an intermediate color.

2. A light emitting diode according to claim 1, wherein said fluorescent particles are made from yttrium aluminum garnet (YAG).

3. A light emitting diode according to claim 1, wherein said light emitting element chip is a blue light emitting diode element made from a gallium nitride compound semiconductor.

4. A light emitting diode according to claim 1, wherein said fluorescent particles and said coloring particles are contained in said bonding agent for mounting the light emitting element chip.

5. The light emitting diode of claim 1, wherein said coloring particles comprise different particles for producing red, blue and green.

6. The light emitting diode of claim 1, wherein said coloring particles comprise different particles of all of said phthalocyanine, anthraquinone, azo and quinophthalone compounds.

* * * * *